United States Patent
Ransdell et al.

(10) Patent No.: US 11,162,602 B2
(45) Date of Patent: Nov. 2, 2021

(54) FLUID CONTROL VALVE, FLOW RATE CONTROL DEVICE, AND DRIVE CIRCUIT

(71) Applicant: HORIBA STEC, Co., Ltd., Kyoto (JP)

(72) Inventors: Jeffrey Ransdell, Irvine, CA (US); Kazuya Tokunaga, Kyoto (JP)

(73) Assignee: HORIBA STEC, Co., Ltd., Kyoto (JP)

( * ) Notice: Subject to any disclaimer, the term of this patent is extended or adjusted under 35 U.S.C. 154(b) by 0 days.

(21) Appl. No.: 16/876,977

(22) Filed: May 18, 2020

(65) Prior Publication Data

US 2020/0386341 A1    Dec. 10, 2020

(30) Foreign Application Priority Data

Jun. 7, 2019   (JP) .............................. JP2019-106952

(51) Int. Cl.
*F16K 31/02*   (2006.01)
*F16K 31/00*   (2006.01)
*F15B 15/20*   (2006.01)

(52) U.S. Cl.
CPC ............ *F16K 31/007* (2013.01); *F15B 15/20* (2013.01); *F16K 31/02* (2013.01); *F15B 2211/62* (2013.01); *F15B 2211/63* (2013.01); *F15B 2211/66* (2013.01)

(58) Field of Classification Search
CPC ........ F16K 31/007; F16K 31/02; F15B 15/20; F15B 2211/62; F15B 2211/63; F15B 2211/66
USPC ........................ 137/487.5; 251/129.1, 129.01
See application file for complete search history.

(56) References Cited

U.S. PATENT DOCUMENTS

| 3,665,945 | A | * | 5/1972 | Ottenstein | G01M 3/2815 137/14 |
| 3,757,808 | A | * | 9/1973 | Peterson | G05D 7/0635 137/2 |
| 3,877,645 | A | * | 4/1975 | Oligschlaeger | G05D 7/0623 239/155 |
| 4,011,491 | A | * | 3/1977 | Grover | H02P 7/291 388/819 |
| 4,065,096 | A | * | 12/1977 | Frantz | F16K 31/0679 251/129.1 |

(Continued)

FOREIGN PATENT DOCUMENTS

| GB | 1312996 A | * | 4/1973 | .............. G04C 3/12 |
| JP | 2009265988 A | | 11/2009 | |

*Primary Examiner* — Minh Q Le
(74) *Attorney, Agent, or Firm* — Alleman Hall Creasman & Tuttle LLP (57) ABSTRACT

A fluid control valve can suppress heat generation when discharging charges from a piezo actuator for contraction and reduce energy necessary to drive the piezo actuator. The fluid control valve includes a piezo actuator and a drive circuit connected to the piezo actuator is adapted so that the drive circuit includes: a flyback transformer including a primary side coil connected to a DC power supply DV and a secondary side coil connected to the piezo actuator; a charge switch that is connected to the primary side coil and switched from on to off when the piezo actuator charges; a discharge switch that is connected to the secondary side coil and switched from off to on when the piezo actuator discharges; and a regenerative capacitor that is connected to the primary side coil and into which electric energy due to the discharge of the piezo actuator is regenerated.

8 Claims, 5 Drawing Sheets

(56) References Cited

U.S. PATENT DOCUMENTS

| | | | | |
|---|---|---|---|---|
| 4,646,531 | A * | 3/1987 | Song | F25D 17/045 |
| | | | | 236/49.3 |
| 4,658,855 | A * | 4/1987 | Doyle | G05D 7/0635 |
| | | | | 137/468 |
| 4,796,017 | A * | 1/1989 | Merenda | A47G 33/0881 |
| | | | | 324/694 |
| 5,628,411 | A * | 5/1997 | Mills | B07C 5/3425 |
| | | | | 209/644 |
| 6,520,479 | B1 * | 2/2003 | Sato | F16K 31/007 |
| | | | | 251/129.06 |
| 7,252,355 | B2 * | 8/2007 | Umeda | B41J 2/04541 |
| | | | | 347/10 |
| 2005/0151445 | A1 * | 7/2005 | Titschert | F16K 31/004 |
| | | | | 310/316.03 |
| 2013/0333774 | A1 * | 12/2013 | Downie | G01L 9/0022 |
| | | | | 137/487.5 |
| 2014/0116431 | A1 * | 5/2014 | Palacharla | A62B 9/006 |
| | | | | 128/202.13 |
| 2019/0093784 | A1 * | 3/2019 | Ito | B07B 11/04 |
| 2019/0353276 | A1 * | 11/2019 | Ito | F16K 31/004 |
| 2020/0166150 | A1 * | 5/2020 | Miyamoto | F16K 31/007 |

\* cited by examiner

FLUID CONTROL VALVE, FLOW RATE CONTROL DEVICE, AND DRIVE CIRCUIT

TECHNICAL FIELD

The present invention relates to a fluid control valve including a piezo actuator and used to control the pressure or flow rate of fluid.

BACKGROUND ART

For example, in a semiconductor manufacturing process, the flow rate of gas to be supplied into a chamber is controlled by a mass flow controller. The mass flow controller is provided with, for example, a fluid control valve including a piezo actuator, and a flow rate sensor. A voltage to be applied to the piezo actuator is controlled so that the deviation between a measured flow rate measured by the flow rate sensor and a set flow rate set by a user decreases (see Patent Literature 1).

Meanwhile, when contracting the piezo actuator from a state where the piezo actuator is extended by voltage application, charges stored in the piezo actuator has to be discharged. Usually, the charges discharged from the piezo actuator are consumed as heat by, for example, resistors in a drive circuit.

However, for example, when the supply and stop of gas is repeated at high speed as in the ALD process, in addition to increasing such waste of energy, the amount of heat generated from a piezo actuator is increased, which may eventually affect flow rate control characteristics and the like.

CITATION LIST

Patent Literatures

Patent Literature 1: Japanese Unexamined Patent Application Publication No. 2009-265988

SUMMARY OF INVENTION

Technical Problem

The present invention has been made in consideration of the problems as described above, and intends to provide a fluid control valve that can suppress heat generation when discharging charges from a piezo actuator for contraction and reduce energy necessary to drive the piezo actuator.

Solution to Problem

The fluid control valve according to the present invention is a fluid control valve including a piezo actuator and a drive circuit connected to the piezo actuator, and the drive circuit includes: a flyback transformer including a primary side coil connected to a DC power supply and a secondary side coil connected to the piezo actuator; a charge switch that is connected to the primary side coil and switched from on to off when the piezo actuator charges; a discharge switch that is connected to the secondary side coil and switched from off to on when the piezo actuator discharges; and a regenerative capacitor that is connected to the primary side coil and in which electric energy due to discharge of the piezo actuator is regenerated.

In such a configuration, when the discharge switch is switched on, charges are discharged from the piezo actuator and stored in the flyback transformer as electric energy, and then when the discharge switch is switched off, the stored electric energy can be stored in the regenerative capacitor from the primary side coil.

Therefore, when the piezo actuator discharges, the electric energy can be prevented from being dissipated as heat. Also, when charging the piezo actuator in a state where the electric energy is stored in the regenerative capacitor, the piezo actuator can be charged also using the electric energy stored in the regenerative capacitor.

For these reasons, it is possible to suppress heat generation when the piezo actuator discharges, and reduce energy necessary to drive the piezo actuator.

In order to allow a current flowing through the primary side of the flyback transformer when the piezo actuator discharges not to flow to the DC power supply but to flow only to the regenerative capacitor, it is only necessary that the drive circuit is one further including a diode whose anode is connected to the DC power supply side and whose cathode is connected to the regenerative capacitor side.

In order to make it possible to smooth a current to be applied to the piezo actuator to apply a substantially constant current and thereby keep constant the opening level of the fluid control valve, it is only necessary that the drive circuit is one further including an output capacitor connected in parallel to the piezo actuator.

Also, the fluid control valve according to the present invention is a fluid control valve including a piezo actuator and a drive circuit connected to the piezo actuator, and the drive circuit includes a charge circuit that is provided with a Darlington connection of multiple stages of transistors and configured to supply a current from the emitter of the last stage to the piezo actuator.

Further, a drive circuit according to the present invention is one connected to a piezo actuator, and the drive circuit includes a charge circuit that includes a Darlington connection of multiple stages of transistors and is configured to supply a current from the emitter of the last stage to the piezo actuator.

In such a configuration, the value of the current flowing through the piezo actuator can be increased more than before to charge the piezo actuator at high speed. Accordingly, the opening level of the fluid control valve can be changed at higher speed to improve response characteristics.

As long as a flow rate control device includes: the fluid control valve according to the present invention; a flow rate sensor that measures the flow rate of fluid flowing through a flow path; and a valve control part that controls the opening level of the fluid control valve on the basis of a measured flow rate by the flow rate sensor, it is possible to reduce heat generation or improve the responsiveness of flow rate control more than before.

Advantageous Effects of Invention

As described, the fluid control valve according to the present invention can recover the electric energy stored in the piezo actuator into the regenerative capacitor when discharging the piezo actuator. For this reason, it is possible to suppress heat generation at the time of the discharge, and when the piezo actuator charges, to reuse the electric energy stored in the regenerative capacitor to thereby achieve energy saving as well.

DESCRIPTION OF EMBODIMENTS

Figure 1:
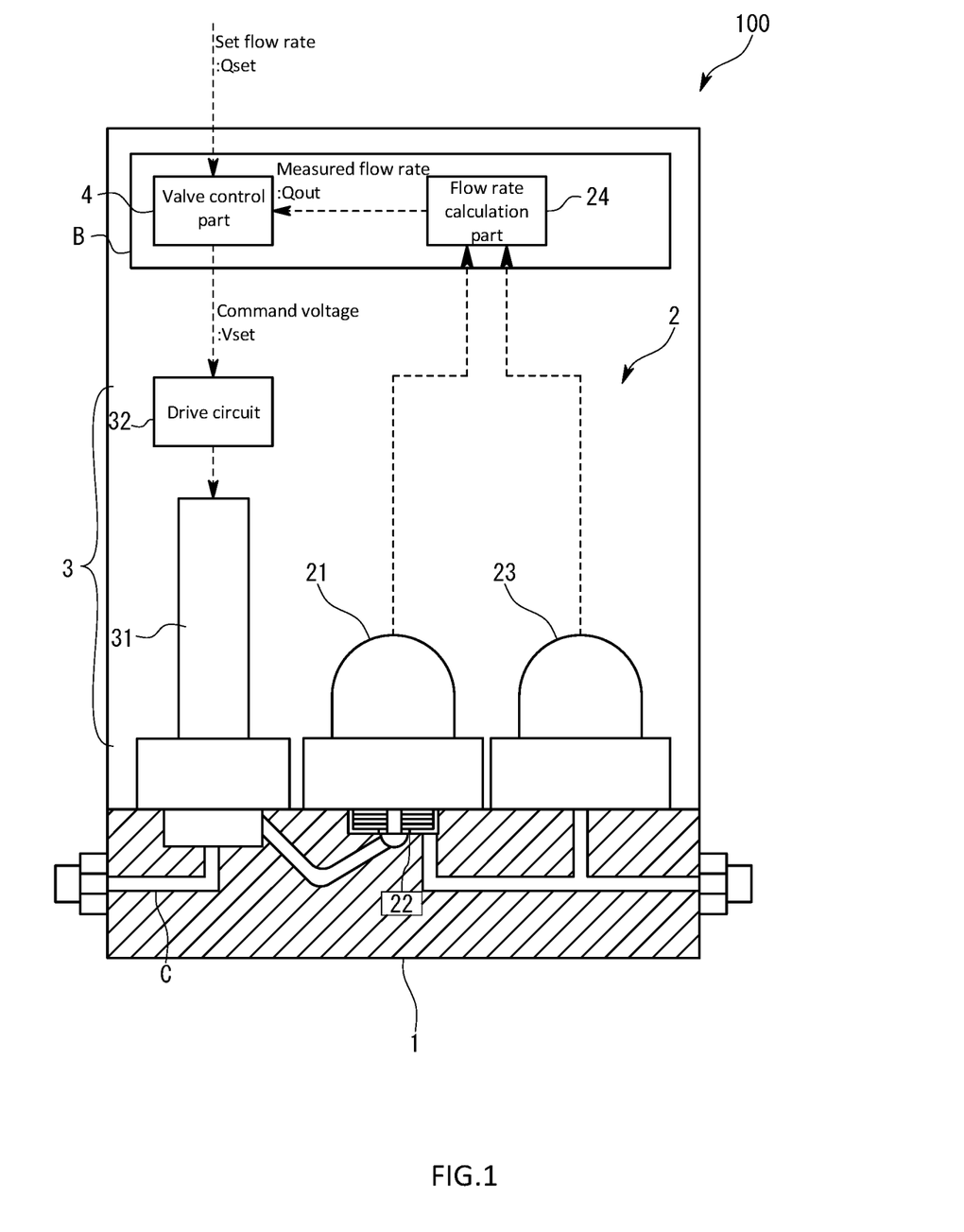
FIG. 1 is a schematic diagram illustrating a flow rate control device using a fluid control valve according to a first embodiment of the present invention.

A fluid control valve 3 according to a first embodiment of the present invention will be described with reference to FIG. 1 and FIG. 2.

The fluid control valve 3 of the first embodiment is one used for a mass flow controller 100 that controls the flow rate of fluid in, for example, a semiconductor manufacturing process. As illustrated in FIG. 1, the mass flow controller 100 is one that packages various types of fluid equipment including the fluid control valve 3, and a control board B for controlling the fluid control valve 3. Specifically, the mass flow controller 100 includes a block 1 inside which a flow path C is formed, and the fluid control valve 3, an upstream side pressure sensor 21, a laminar flow element 22, and a downstream side pressure sensor 23 are attached to the block 1. In addition, the control board B is a so-called computer including a CPU, a memory, an A/D converter, a D/A converter, and various types of input/output equipment, and fulfills functions as at least a flow rate calculation part 24 and a valve control part 4 by executing a program stored in the memory.

The flow rate calculation part 24 calculates the flow rate of fluid flowing through the block 1 from respective measured pressures measured by the upstream side pressure sensor 21 and the downstream side pressure sensor 23. That is, the upstream side pressure sensor 21, the laminar flow element 22, the downstream side pressure sensor 23, and the flow rate calculation part 24 constitute a so-called pressure type flow rate sensor 2. In addition, as a flow rate calculation formula used in the flow rate calculation part 24, an existing one can be used. Further, the flow rate calculated by the flow rate calculation is outputted to the valve control part 4 as a measured flow rate.

The valve control part 4 performs flow rate feedback control of the opening level of the fluid control valve 3 so that the deviation between a set flow rate set by a user and the measured flow rate measured by the flow rate calculation decreases. In the first embodiment, the valve control part 4 is a PID controller that is inputted with the deviation between the set flow rate and the measured flow rate and performs a PID operation to output a command for a voltage to be applied to the fluid control valve.

The fluid control valve includes: a valve seat; a valve body that is displaced with respect to the valve seat; a piezo actuator 31 that displaces the valve body; and a drive circuit 32 that drives the piezo actuator 31.

The piezo actuator 31 is, for example, one in which piezo elements and electrodes are alternately stacked. The piezo actuator 31 changes its length to a length corresponding to a voltage applied by the drive circuit 32.

Figure 2:
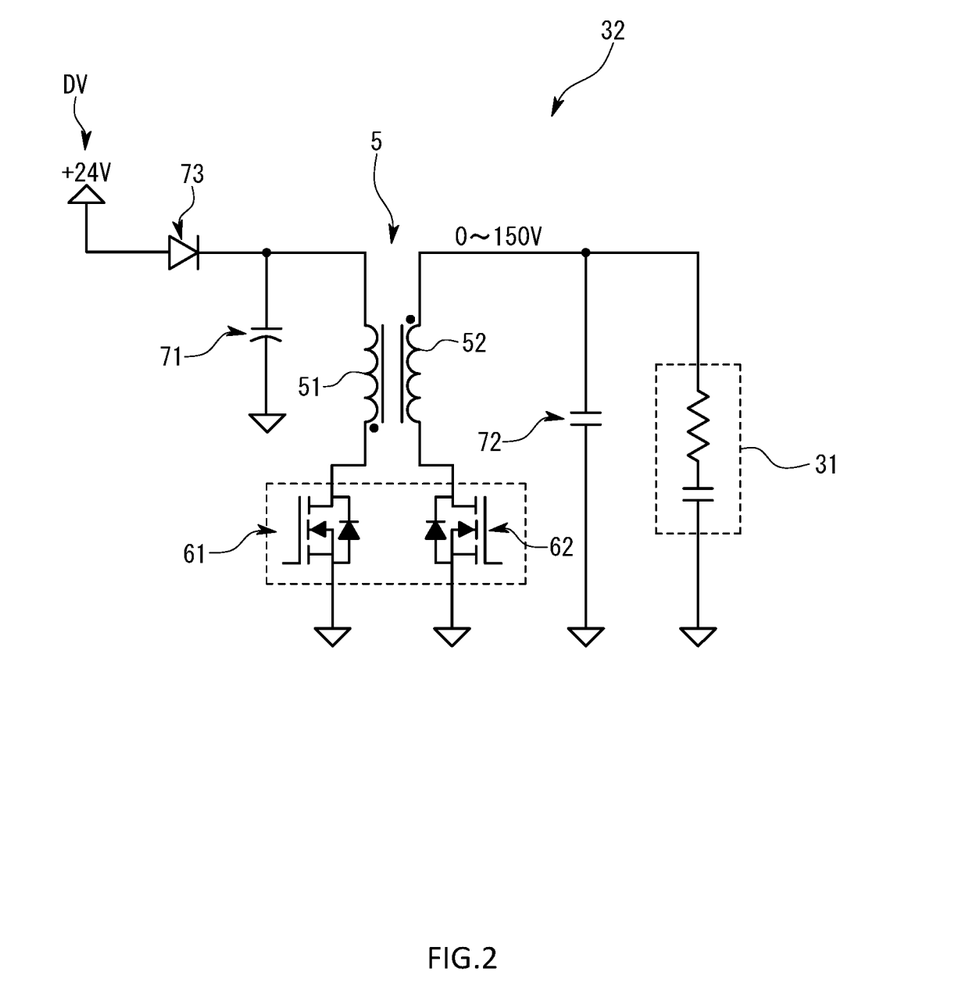
FIG. 2 is a schematic circuit diagram illustrating a drive circuit for the fluid control valve according to the first embodiment.

As illustrated in FIG. 2, the drive circuit 32 is a DC/DC converter including a flyback transformer, a charge switch 61, a discharge switch 62, regenerative capacitor 71, a diode 73, and an output capacitor 72, and controls the charge/discharge of the piezo actuator 31. Also, the drive circuit 32 is configured to, when the piezo actuator 31 discharges, regenerate the resulting electric energy.

The flyback transformer 5 includes: a primary side coil 51 directly connected to a DC power supply DV; and a secondary side coil 52 connected to the piezo actuator 31.

The low voltage side of the primary side coil 51 is connected with the charge switch 61 that is switched from on to off when the piezo actuator 31 charges. Also, the low voltage side of the secondary side coil 52 is connected with the discharge switch 62 that is switched from off to on when the piezo actuator 31 discharges. As the charge switch 61 and the discharge switch 62, for example, FETs are used, and a voltage command outputted from the valve control part 4 is inputted to each gate.

The regenerative capacitor 71 is connected to the high voltage side of the primary side coil 51 and electric energy due to the discharge of the piezo actuator 31 is regenerated.

The diode 73 is such that the anode thereof is connected to the DC power supply DV side and the cathode thereof is connected to the regenerative capacitor 71 side. That is, it is configured that when the piezo actuator 31 discharges, a current generated from the primary side coil 51 of the flyback transformer 5 flows only to the regenerative capacitor 71.

The output capacitor 72 is connected in parallel to the piezo actuator 31, and smooths a voltage waveform applied to the piezo actuator 31.

In the following, the operation of the drive circuit 32 will be described.

When charging the piezo actuator 31 at a predetermined voltage to keep the fluid control valve 3 at a predetermined opening level, the valve control part 4 inputs a command for an on/off voltage having a predetermined frequency calculated by the PID operation to the gate of the charge switch 61.

When from the state where the piezo actuator 31 is applied with the predetermined voltage, discharging the piezo actuator 31 to change the opening level, the valve control part 4 inputs a command for an on/off voltage having a predetermined frequency to the gate of the discharge switch 62. When the discharge switch 62 is switched on, charges charged in the piezo actuator 31 flow to the secondary side coil 52 and is stored in the flyback transformer as electric energy. When the discharge switch 62 is switched off from this state, the current flows from the primary side coil 51 to the regenerative capacitor, into which the electric energy is stored. After achieving a desired opening level by repeating the discharge, the valve control part 4 again inputs a command for an on/off voltage having a frequency corresponding to a voltage necessary to keep the opening level to the gate of the charge switch 61. At this time, the electric energy stored in the regenerative capacitor 71 is also used to charge the piezo actuator 31.

The fluid control valve 3 of the first embodiment configured as described can regenerate the electric energy into the regenerative capacitor 71 when the piezo actuator 31 discharges, and therefore suppress heat generation at the time of the discharge as compared with before.

Accordingly, even in the case of applications where the fluid control valve 3 is repeatedly switched on/off at high speed, it is possible to prevent a situation where the drive circuit 32 of the fluid control valve 3 generates excessive heat to adversely affect its control characteristics.

Also, since the electric energy stored in the regenerative capacitor 71 is used at the time of the next charge, it is possible to reduce electric energy consumed to drive the fluid control valve 3.

A fluid control valve 3 according to a second embodiment of the present invention will be described with reference to FIG. 3 to FIG. 5. In addition, members corresponding to the members described in the first embodiment are marked with the same reference signs.

The fluid control valve 3 of the second embodiment is different from the first embodiment in the configuration of the drive circuit 32, and correspondingly different in the configuration of the valve control part 4 as well.

Figure 3:
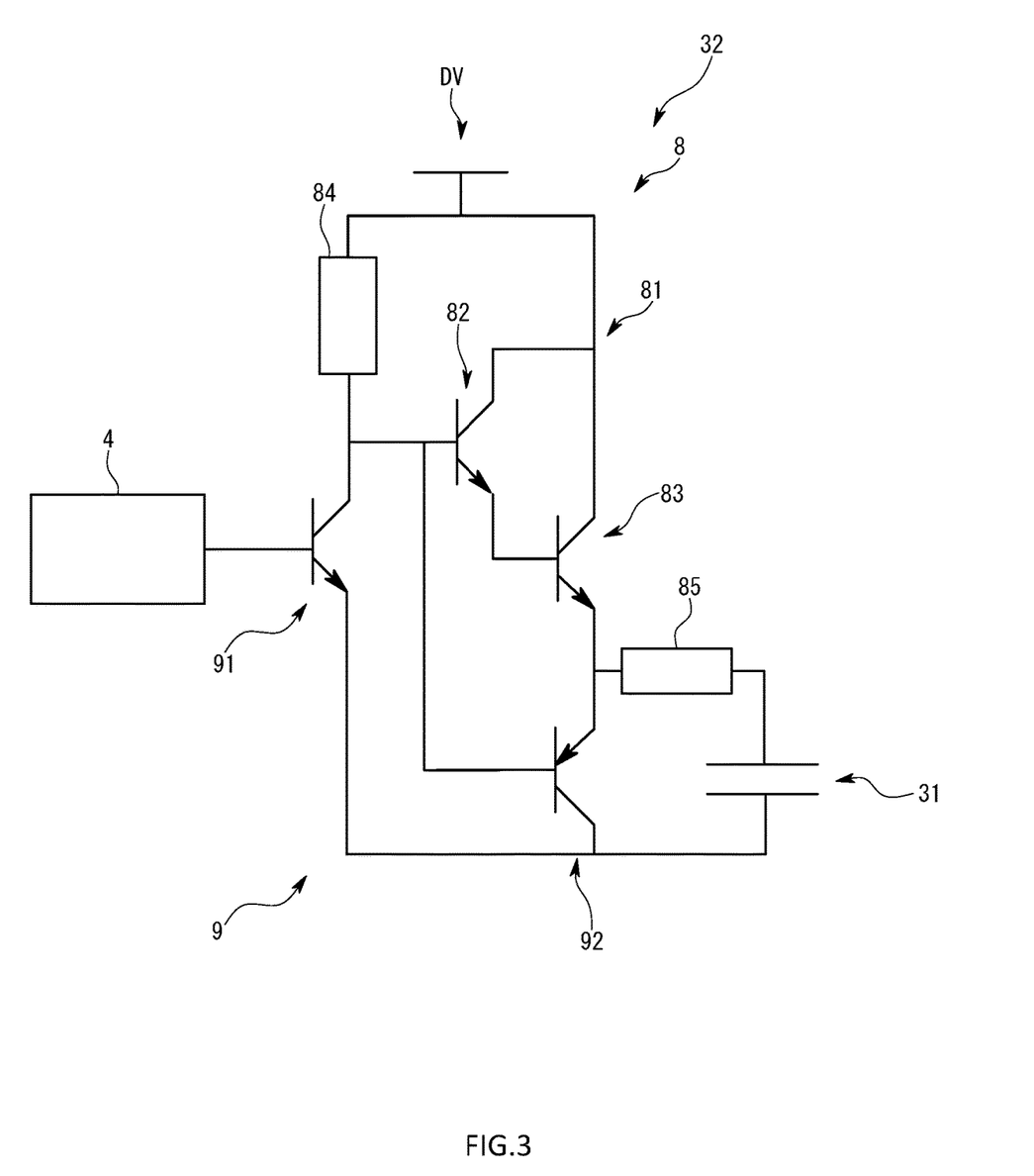
FIG. 3 is a schematic circuit diagram illustrating a drive circuit for a fluid control valve according to a second embodiment.
Figure 4:
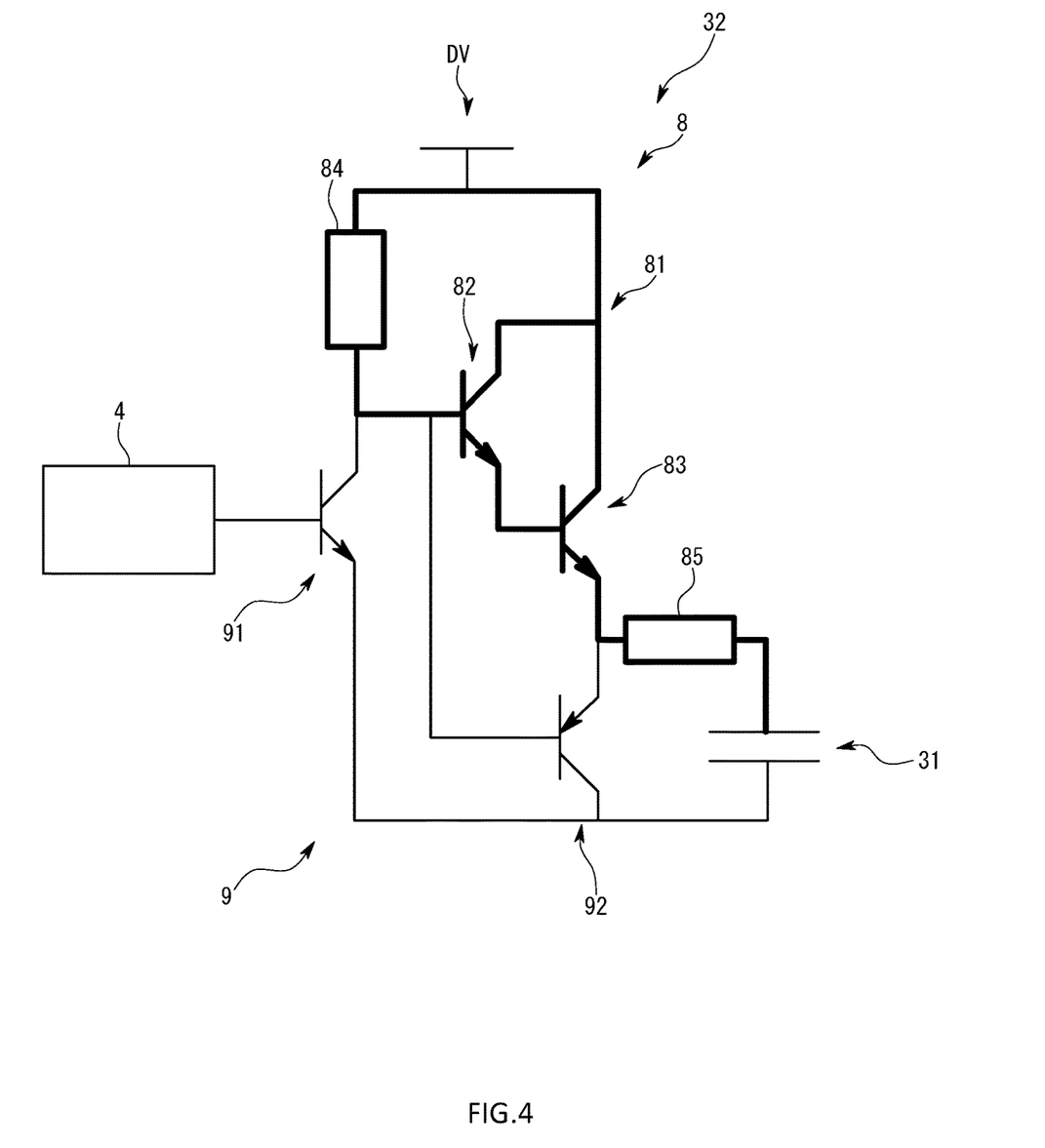
FIG. 4 is a schematic circuit diagram illustrating a charge circuit of the drive circuit according to the second embodiment.
Figure 5:
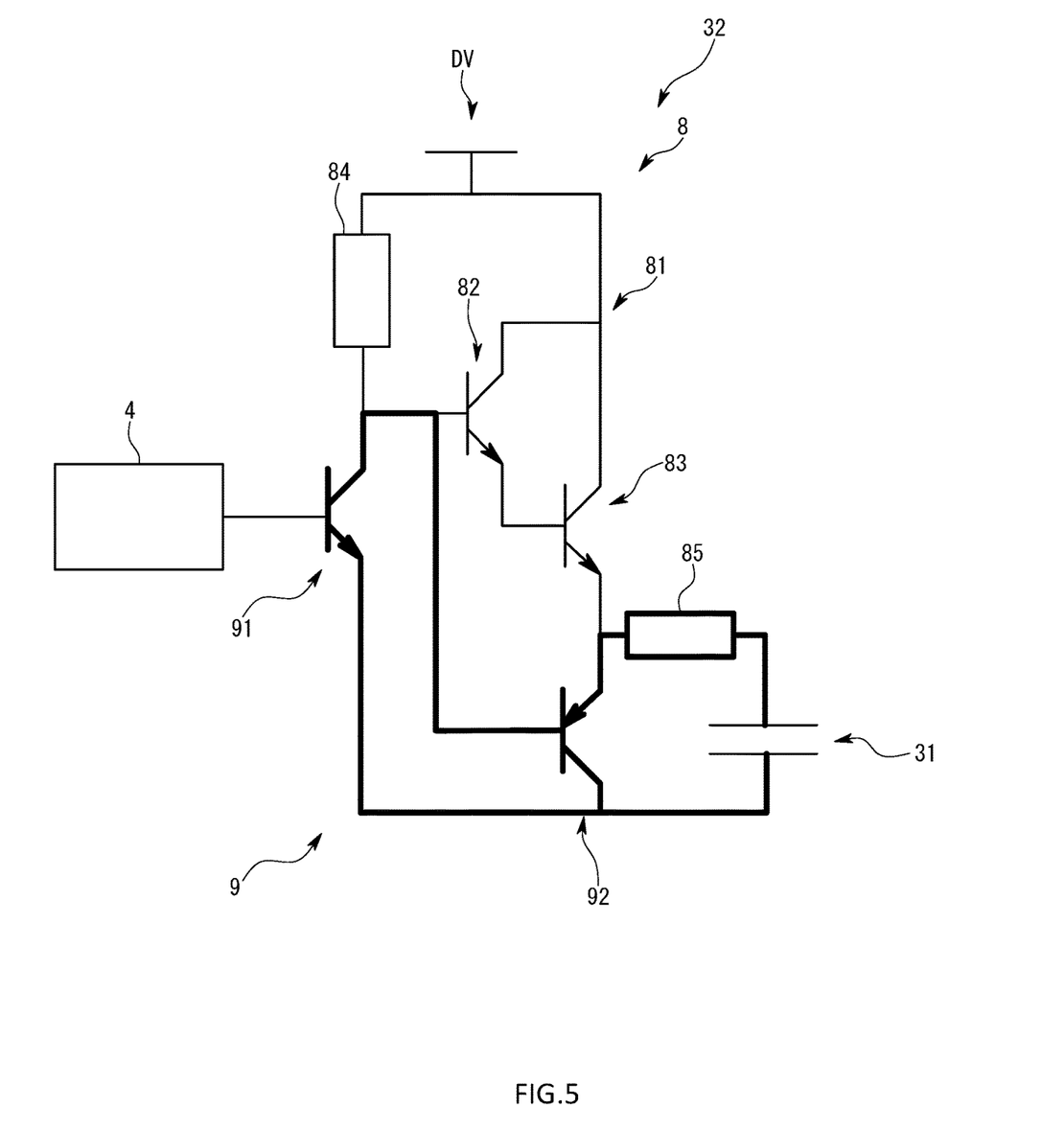
FIG. 5 is a schematic circuit diagram illustrating the discharge circuit of the drive circuit according to the second embodiment.

As illustrated in FIG. 3, the drive circuit 32 in the second embodiment is configured to include multiple bipolar transistors and resistors, and configured of a charge circuit 8 indicated by thick lines in FIG. 4 and a discharge circuit 9 indicated by thick lines in FIG. 5.

The charge circuit 8 includes a Darlington connection 81 of multiple stages of NPN transistors, and is configured so that a current is supplied from the emitter of the last stage to the piezo actuator 31. Specifically, the charge circuit 8 includes: the Darlington connection 81 of two stages of transistors 82 and 83; a first resistor 84 that is provided in parallel to the Darlington connection 81 with reference to the DC power supply DV and whose low voltage side is connected to the gate of the first stage transistor 82 of the Darlington connection 81; and a second resistor 85 that is provided between the high voltage side of the piezo actuator 31 and the emitter of the last stage transistor 83 of the Darlington connection 81.

It is configured that a voltage from the DC power supply is applied, a current flowing through the first resistor 84 is inputted as a gate current for the Darlington connection 81, and in this embodiment, a 100-fold amplified collector current flows through the second resistor 85 and the piezo actuator 31.

The discharge circuit 9 includes: a control switch 91 that is an NPN transistor whose gate is inputted with a commanded voltage outputted from the valve control part 4; and a PNP transistor 92.

The control switch 91 is such that the collector thereof is connected between the low voltage side of the first resistor 84 and the gate of the first stage transistor 82 of the Darlington connection 81 and the emitter thereof is connected to a low voltage side.

The emitter of the PNP transistor 92 is connected between the emitter of the last stage transistor 83 of the Darlington connection 81 and the high voltage side of the second resistor 85. Also, the gate of the PNP transistor 92 is connected between the low voltage side of the first resistor 84 and the gate of the first stage transistor 82 of the Darlington connection 81. The collector of the PNP transistor 92 is connected to the low voltage side.

The discharge circuit 9 is switched on by applying a voltage to the gate of the control switch 91, and discharge from the piezo actuator 31 is performed.

In such a drive circuit 32 in the second embodiment, since the charge circuit 8 includes the Darlington connection 81, a high current can be provided when the piezo actuator 31 charges, and charges can be charged in a short time. For this reason, the piezo actuator 31 can be displaced at high speed to improve the responsiveness of the fluid control valve 3 more than before.

Other embodiments will be described.

In each of the embodiments, the fluid control valve is used for the mass flow controller as a flow rate control device, but may be used as a pressure control valve or a shut-off valve in a pressure control device.

The Darlington connection is not limited to one including the two stages of transistors, but may be one including three or more stages of transistors.

Besides, embodiments may be partially mutually combined or modified without departing from the scope of the present invention.

LIST OF REFERENCE CHARACTERS

100: Mass flow controller
3: Fluid control valve
31: Piezo actuator
32: Drive circuit
5: Flyback transformer
51: Primary side coil
52: Secondary side coil
61: Charge switch
62: Discharge switch
71: Regenerative capacitor
72: Output capacitor
73: Diode
8: Charge circuit
81: Darlington connection

The invention claimed is:

1. A fluid control valve comprising a piezo actuator and a drive circuit connected to the piezo actuator, wherein
the drive circuit comprises:
a flyback transformer including a primary side coil connected to a DC power supply and a secondary side coil connected to the piezo actuator;
a charge switch that is connected to the primary side coil and switched from on to off when the piezo actuator charges;
a discharge switch that is connected to the secondary side coil and switched from off to on when the piezo actuator discharges; and
a regenerative capacitor that is connected to the primary side coil and into which electric energy due to discharge of the piezo actuator is regenerated.

2. The fluid control valve according to claim 1, wherein the drive circuit further comprises
a diode whose anode is connected to a DC power supply side and whose cathode is connected to a regenerative capacitor side.

3. The fluid control valve according to claim 1, wherein the drive circuit further comprises
an output capacitor connected in parallel to the piezo actuator.

4. A fluid control valve comprising a piezo actuator and a drive circuit connected to the piezo actuator, wherein
the drive circuit comprises a charge circuit that includes:
a Darlington connection that has a first stage transistor and a last stage transistor whose gate is connected to an emitter of the first stage transistor, wherein the Darlington connection is configured to supply a current from an emitter of a last stage to the piezo actuator; and
a first resistor that is connected to a gate of the first stage transistor of the Darlington connection, and
the drive circuit further comprises a discharge circuit that includes:
a transistor whose emitter is connected to the emitter of the last stage transistor of the Darlington connection, whose gate is connected between a low voltage side of the first resistor and the gate of the first stage transistor of the Darlington connection, and whose collector is connected to the low voltage side.

5. A flow rate control device comprising:

the fluid control valve according to claim 1;

a flow rate sensor that measures a flow rate of fluid flowing through a flow path; and a valve control part that controls an opening level of the fluid control valve on a basis of a measured flow rate by the flow rate sensor.

6. A drive circuit connected to a piezo actuator, the drive circuit comprising a charge circuit that includes:

a Darlington connection that has a first stage transistor and a last stage transistor whose gate is connected to an emitter of the first stage transistor, wherein the Darlington connection is configured to supply a current from an emitter of a last stage to the piezo actuator; and     a first resistor that is connected to a gate of the first stage transistor of the Darlington connection, and the drive circuit further comprising a discharge circuit that includes:

a transistor whose emitter is connected to the emitter of the last stage transistor of the Darlington connection, whose gate is connected between a low voltage side of the first resistor and the gate of the first stage transistor of the Darlington connection, and whose collector is connected to the low voltage side.

7. The fluid control valve according to claim 4, wherein the discharge circuit further includes:

a control switch that is a transistor whose gate is inputted with a commanded voltage, whose collector is connected between the low voltage side of the first resistor and the gate of the first stage transistor of the Darlington connection, and whose emitter is connected to the low voltage side.

8. The fluid control valve according to claim 6, wherein the discharge circuit further includes:

a control switch that is a transistor whose gate is inputted with a commanded voltage, whose collector is connected between the low voltage side of the first resistor and the gate of the first stage transistor of the Darlington connection, and whose emitter is connected to the low voltage side.

\* \* \* \* \*